United States Patent
Gussen et al.

(10) Patent No.: US 10,024,926 B2
(45) Date of Patent: Jul. 17, 2018

(54) METHOD AND DEVICE FOR MONITORING AT LEAST ONE TRACTION BATTERY OF A MOTOR VEHICLE

(71) Applicant: Ford Global Technologies, LLC, Dearborn, MI (US)

(72) Inventors: Uwe Gussen, Huertgenwald (DE); Thomas Rambow, Aachen (DE); Goetz-Philipp Wegner, Dortmund (DE); Rainer Busch, Aachen (DE)

(73) Assignee: Ford Global Technologies, LLC, Dearborn, MI (US)

( * ) Notice: Subject to any disclaimer, the term of this patent is extended or adjusted under 35 U.S.C. 154(b) by 274 days.

(21) Appl. No.: 14/168,433

(22) Filed: Jan. 30, 2014

(65) Prior Publication Data
US 2014/0210638 A1   Jul. 31, 2014

(30) Foreign Application Priority Data
Jan. 30, 2013   (DE) .......................... 10 2013 201 529

(51) Int. Cl.
*G01R 31/36* (2006.01)
*B60L 3/00* (2006.01)
(Continued)

(52) U.S. Cl.
CPC ........ *G01R 31/3689* (2013.01); *B60L 3/0046* (2013.01); *B60L 11/1859* (2013.01);
(Continued)

(58) Field of Classification Search
CPC .......................... B60L 3/0046; B60L 11/1859; B60L 11/1861; B60L 2260/50; B60L 11/1842; B60L 11/1844; B60L 11/1848; B60L 11/1862; B60L 2230/16; B60L 2250/10; G01R 31/3606; G01R 31/3648; G01R 31/3679; G01R 31/3689; G01R 31/3686;
(Continued)

(56) References Cited

U.S. PATENT DOCUMENTS 5,596,261 A * 1/1997 Suyama .............. B60L 11/1803
                                                                320/109
5,936,385 A * 8/1999 Patillon .............. G01R 31/3651
                                                                320/130
(Continued)

FOREIGN PATENT DOCUMENTS

GB         2455160 A * 6/2009 ............. G07C 5/008

*Primary Examiner* — Quan-Zhen Wang
*Assistant Examiner* — Stephen Burgdorf
(74) *Attorney, Agent, or Firm* — David B. Kelley; Brooks Kushman P.C.

(57) ABSTRACT

A method for monitoring at least one traction battery of a motor vehicle includes the steps of determining basic data for the prediction of a deeply discharged state of the at least one traction battery by a battery monitoring system associated with the motor vehicle, transmitting the basic data to an external computer via a first communications link, determining an expected point in time of the deep discharge by the external computer, and transmitting a first warning signal to a first monitoring instantiation of the motor vehicle that can be specified if the determined point in time of the deep discharge is reached apart from an early warning time. A device for monitoring at least one traction battery of a motor vehicle is also disclosed.

3 Claims, 2 Drawing Sheets

(51) Int. Cl.
*B60L 11/18* (2006.01)
*H02J 7/00* (2006.01)

(52) U.S. Cl.
CPC ...... *B60L 11/1861* (2013.01); *G01R 31/3606* (2013.01); *H02J 7/0047* (2013.01); *B60L 2260/50* (2013.01); *G01R 31/3648* (2013.01); *Y02T 10/7005* (2013.01); *Y02T 10/705* (2013.01); *Y02T 10/7044* (2013.01); *Y02T 90/16* (2013.01)

(58) Field of Classification Search
CPC .... G01R 31/3693; H02J 7/0047; H02J 7/004; B60W 10/26; B60W 2510/244; Y02T 10/7005; Y02T 10/7044; Y02T 90/14; Y02T 90/16; Y02T 90/163
USPC ............. 340/870.09; 320/132, 134, 136
See application file for complete search history.

(56) References Cited

U.S. PATENT DOCUMENTS

| | | | |
|---|---|---|---|
| 8,630,764 B2* | 1/2014 | Dabholkar | H04W 4/028 701/32.3 |
| 8,631,448 B2* | 1/2014 | Christensen | H04N 7/17318 725/112 |
| 2005/0060067 A1* | 3/2005 | Nishida | B60R 16/0231 701/2 |
| 2008/0243626 A1* | 10/2008 | Stawar | B62B 3/1424 705/23 |
| 2010/0164790 A1* | 7/2010 | Wisnewski | H01Q 1/3208 455/67.11 |
| 2012/0256751 A1* | 10/2012 | Nallabelli | H04W 52/0277 340/636.1 |
| 2013/0257344 A1 | 10/2013 | Millet et al. | |
| 2014/0075464 A1* | 3/2014 | McCrea | G06F 19/3418 725/14 |

* cited by examiner

METHOD AND DEVICE FOR MONITORING AT LEAST ONE TRACTION BATTERY OF A MOTOR VEHICLE

CROSS-REFERENCE TO RELATED APPLICATION

This application claims priority to German Patent Application No. 10 2013 201 529.1, filed Jan. 30, 2013, the disclosure of which is incorporated in its entirety by reference herein.

TECHNICAL FIELD

This disclosure relates to a method and a device for monitoring at least one traction battery of a motor vehicle.

BACKGROUND

Motor vehicles with a battery electric drive or a hybrid drive are becoming increasingly widespread. With such vehicles the drive energy for the electric drive is at least partly provided by one or a plurality of traction batteries. Such a traction battery can in particular be a lithium ion battery. If a lithium ion battery is discharged to below a discharge end voltage or is discharged further than corresponds to a critical state of charge, then there is a risk that the battery will be irreversibly damaged, e.g. by the chemicals contained in the battery cells destroying the battery itself. This process is irreversible and cannot be undone by re-charging the battery. Such deep discharging therefore in general necessitates replacement of the battery, which is associated with considerable cost. In addition, a battery electric vehicle or hybrid vehicle whose traction battery has been deeply discharged can no longer be readily put into operation. A battery electric vehicle with a deeply discharged traction battery must generally be towed. It is therefore known to monitor the state of charge of a traction battery of a motor vehicle in order to be able to prevent deep discharging.

According to WO 2012/085615 A1, an energy supply system of a motor vehicle comprises a battery and a battery control unit that monitors the state of charge of the battery. While the motor vehicle is not being operated, a state of charge of the battery is monitored by the battery control unit and if a lower threshold value of the state of charge is reached a communications device of the motor vehicle is activated in order to send an alarm to a receiving device located outside of the motor vehicle because of the critical state of charge. Recharging of the battery can then be initiated because of the alarm signal received by the receiving device.

It is known from EP 2 068 161 A2 to transmit data from a battery monitoring system installed in the motor vehicle to an external display device together with other diagnostic information about the motor vehicle.

In GB 2 455 160 A, a monitoring system for a battery module of an electric vehicle is disclosed wherein the physical and electrical variables of the battery module are recorded and transferred to an external system via a communications unit. If the received data contains an abnormal state of the battery module, the external system sends an error message to a user via wireless telecommunications means to remind the user that a service is due or to inform the user about the state of the motor vehicle.

The known methods and systems for monitoring a traction battery of a motor vehicle are not sufficiently reliable under all operating conditions. In particular, the output of an alarm signal relies both on a function of a monitoring system associated with the motor vehicle and also on the function of a wireless communications link. However, both cannot always be reliably guaranteed in such cases in which the critical state of charge of the traction battery can occur.

SUMMARY

A method and a device for monitoring at least one traction battery of a motor vehicle are provided wherein the mentioned disadvantages are avoided as far as possible.

One method relates to the monitoring of at least one traction battery of a motor vehicle, especially to the monitoring of a state of charge of the at least one traction battery. The motor vehicle can be a vehicle with a battery electric drive or a hybrid drive, wherein the drive energy for the electric drive is at least partly supplied by the at least one traction battery. With the method in a first step, current basic data of the at least one traction battery are determined by a battery monitoring system (Battery Monitoring system, BMS) associated with the motor vehicle. The basic data are the data that are required for the prediction of a deeply discharged state of the traction battery. A deeply discharged state is a state of charge of the traction battery in which, because of discharging below a predetermined minimum state of charge, irreversible damage to the traction battery is possible and/or putting the motor vehicle into operation can no longer readily take place. A deeply discharged state is evident, for example, through the reduction of a voltage of the traction battery to a value below a discharge end voltage.

The determined basic data of the traction battery are present state data of the traction battery, such as the respective present battery current, the present battery voltage and the present battery temperature. The basic data of the traction battery can also comprise a determined state of charge (State of Charge, SOC) and/or a charge capacity (State of Health, SOH) of the traction battery. The state of charge of the battery (SOC) gives the fraction of the current maximum storable charge that is currently stored, and can, for example, be specified as a percentage of the currently storable charge. The charge capacity (SOH) specifies the fraction of the target capacity of the battery that can currently be used, i.e. the percentage of the originally available capacity of the battery that is currently still available for storing electrical energy. The available charge capacity reduces over the service life of the traction battery. The basic data are determined by a battery monitoring system associated with the motor vehicle. The basic data can also comprise data of the charge or discharge history of the traction battery and, for example, the battery type and the date of manufacture of the battery or possibly other data that characterize the traction battery. If the motor vehicle comprises a plurality of traction batteries, the determined basic data preferably relate to all traction batteries of the motor vehicle.

The determined basic data are transferred to an external computer, e.g., a stationary server, a computer of a computer system, or a smart phone. The transmission of the basic data takes place via a first communications link, which comprises a wireless communications link between a transmitter device associated with the motor vehicle and a stationary receiving device. The first communications link can comprise other wireless or wired transmission paths and the data can be transferred via a network. The first communications link is preferably designed as a communications link with a GPRS protocol. For transferring the basic data to the external computer, it can in principle be sufficient if a one-off transmission of the basic data via the first communications link to the external computer takes place during an operating cycle of the motor vehicle between start-up and parking (a transition to a "sleep mode").

An expected point in time of a deep discharge is determined by the external computer, i.e., a point in time at which a deeply discharged state of the traction battery is expected to be reached, or of at least one traction battery if the motor vehicle comprises a plurality of traction batteries. The point in time of the deep discharge can, for example, be pre-calculated assuming an ongoing load of the traction battery corresponding to the current load. In particular, a deeply discharged state can also be reached after a certain time when parked, i.e. in the switched off state or in a "sleep mode" of the motor vehicle, through permanently operated loads and/or through self-discharging of the traction battery.

Reaching a first warning point in time is monitored by the external computer and if this is reached a first warning signal is transmitted to a first monitoring instantiation that can be predetermined. The warning point in time is the point in time that is in advance of the expected point in time of the deep discharge by an early warning time that can be specified. Reaching the first warning point in time can, for example, be monitored by a comparison of the determined point in time of the deep discharge with a time of the external computer taking into account the early warning time. The first monitoring instantiation of the motor vehicle can be defined by the driver of the motor vehicle and can, for example, be a mobile communications device of the driver, e.g., a mobile telephone, a smart phone, or a laptop computer. The first monitoring instantiation can also be a landline telephone or another stationary communications device. The transmission of the first warning signal takes place via a suitable wireless or wired communications link. In particular, in the case where the first monitoring instantiation is a smart phone or a laptop computer, the external computer can be identical with the first monitoring instantiation. The first monitoring instantiation can also be a communications device of the motor vehicle; a transmission of the first warning signal to a communications device associated with the motor vehicle is advantageous if the driver is in the vehicle or close to the vehicle.

The driver can be informed about reaching a critical state of discharge of the at least one traction battery of the motor vehicle by basic data of the traction battery being determined by a battery monitoring system connected to the motor vehicle, the basic data being transferred to a computer external to the motor vehicle, an expected point in time of a deep discharge being determined from the basic data and a warning signal being transmitted to a first monitoring instantiation, which is a mobile communications device of the driver, at a specified point in time. By transmitting the first warning signal taking into account an early warning time, the driver can be given the option of taking timely countermeasures such as to return to the motor vehicle and to start it up or to cause charging of the at least one traction battery. By determining the expected point in time of the deep discharge by means of the external computer, the special advantage can be achieved that the determination of the expected point in time of the deep discharge and the transmission of the first warning signal can take place independently of the on-board systems of the motor vehicle and independently of the present existence of the first communications link. Thus a warning signal can also be transmitted to the first monitoring instantiation or to the driver if the motor vehicle has been parked at a point where there is no wireless communications link, as is often the case, for example, in closed buildings or in underground car parks.

The pre-calculation of the expected point in time of the deep discharge and monitoring of the first warning point in time for transmitting the first warning signal to the first monitoring instantiation is advantageous while the motor vehicle is at rest and if the driver has left the motor vehicle. Leaving the motor vehicle can, for example, be determined by means of door contacts or seat occupancy sensors. In an advantageous manner, it is therefore provided that at least when parking or leaving the motor vehicle, the basic data that have been determined at that point in time or previously are transmitted via the first communications link to the external computer; said basic data are then available for determination of the expected point in time of the deep discharge. By transmitting the basic data at least when parking and/or leaving the motor vehicle or at a point in time related thereto, it can be achieved that the data determined at the start of the stationary period and thus the current data are available for determining the deeply discharged state and for the warning measures that may be necessary during a stationary period of the motor vehicle. This enables a particularly accurate determination of the point in time of the deep discharge.

According to one embodiment, the quality of transmission of the first communications link is continuously monitored, and in the event of a loss of quality of transmission the current basic data are transmitted. These are available as interim basic data for the determination of the expected point in time of the deep discharge. If following the detected reduction of the quality of the first communications link the same is interrupted, said basic data are used for determining the point in time of the deep discharge. If on the other hand the first communications link remains available even after a detected degradation of quality or if the quality of transmission improves again, further current basic data can be transferred and used for determining the point in time of the deep discharge, especially in the case of parking or leaving the motor vehicle. By these measures it can be ensured that even in the case in which the first communications link is interrupted, the external computer has the maximum possible amount of current basic data for determining the point in time of the deep discharge.

In particular, it can be provided in an advantageous manner that only when parking and/or leaving the motor vehicle or in the event of a determined degradation of the quality of transmission of the first communications link the basic data determined at this point in time or previously can be transmitted. This enables the loading or utilization of the first communications link associated with the transmission of the data to be minimized.

Alternatively it can be provided that the steps of determining the basic data, transmitting the basic data to the external computer and determining an expected point in time of the deep discharge are performed repeatedly or continuously with a time period that can be specified in advance or in a time period, for example, specified by the battery monitoring system or by the first communications link. This makes available continuously updated basic data for the pre-calculation of the point in time of the deep discharge, whereby said data can be determined with increased accuracy. If the first communications link is interrupted during operation of the motor vehicle, the respective last transmitted basic data are used for determining the point in time of the deep discharge. Even if the motor vehicle is parked at a point at which the first communications link is not available, an accurate prediction of the point in time of the deep discharge is therefore possible.

Preferably when starting the motor vehicle and/or when the driver returns to the motor vehicle, a start signal is transmitted via the first communications link to the external computer. The return of the driver to the motor vehicle can, for example, be detected by means of door contacts or seat occupancy sensors. The start signal can contain the current basic data or represents at least one signal forming the basis on which the external computer determines that the motor vehicle has been started, and the determination of the expected point in time of the deep discharge is adapted accordingly; the first monitoring instantiation can be selected as a communications device of the motor vehicle itself based on the start signal. If at the point in time of starting the motor vehicle the first communications link is not available, the start signal is transmitted when the first communications link is first made following the interruption. This enables the accuracy of determining the point in time of the deep discharge to be further improved.

In a preferred manner, operating data of the motor vehicle that are relevant to determining the expected point in time of the deep discharge are recorded by an information system of the motor vehicle and are transmitted together with the basic data of the traction battery to the external computer via the first communications link. The operating data of the motor vehicle include the external temperature, the distance covered following a previous charging of the at least one traction battery, and/or a current geographical position of the motor vehicle, which can be determined, for example, by a GPS-based navigation system. The determination and transmission of the operating data of the motor vehicle to the external computer not only enable a further improvement of the accuracy of determining the point in time of the deep discharge, but potentially also enable the targeted introduction of countermeasures.

Preferably, the calculation of the expected point in time at which the at least one traction battery reaches the deeply discharged state takes place on the basis of a computer model of the at least one traction battery, which is stored in a memory that can be accessed by the external computer, e.g. in a memory of the computer itself. The data on which the model is based can be entered by a user or can be called up from a database by entering the battery type and other data of the at least one traction battery, or can be transmitted from the battery monitoring system via the first communications link to the first computer. The battery model can comprise known algorithms for pre-calculation of the point in time of the deep discharge.

It is also preferred that the early warning time is determined depending on a current location of the motor vehicle. In particular, the current location can be determined on the basis of the transmitted geographical position of the motor vehicle. A current location of the first monitoring instantiation can also be determined, which can for example be specified as a fixed value, especially if the first monitoring instantiation is designed to be stationary, or which can be determined from data of a mobile telephone network or of a GPS receiver. By a comparison of the current location of the motor vehicle with that of the first monitoring instantiation, the early warning time can be calculated such that the driver has sufficient time to return to the motor vehicle and to initiate countermeasures after receiving the first warning signal.

According to one embodiment, the reception of a confirmation signal is monitored by the external computer and in the case in which no confirmation signal is received within a reaction time that can be specified following transmission of the first warning signal, a second warning signal is transmitted to a second monitoring instantiation. The second warning signal can be transferred via a wireless or a wired communications link. Preferably, the communications link via which the first warning signal is transmitted is of bidirectional design and is designed for transmitting the confirmation signal from the first monitoring instantiation to the external computer. The second monitoring instantiation can, for example, be associated with another person that can be predetermined. In the case in which the driver does not cause a confirmation signal within the reaction time, said second monitoring instantiation can itself engage measures for preventing deep discharging, e.g. charging the at least one traction battery. The reaction time can, for example, be 8 hours.

Preferably, following transmission of the second warning signal, the reception of a second confirmation signal is monitored and in the case in which no second confirmation signal is received within a further reaction time following transmission of the second warning signal, a third warning signal is transmitted to a third monitoring instantiation by the external computer. The third monitoring instantiation can, for example, be a motor vehicle workshop or a breakdown service, which can arrange towing of the motor vehicle and charging of the traction battery. The further reaction time can, for example, also be 8 hours.

A device for monitoring at least one traction battery of a motor vehicle, especially a battery electric vehicle or a hybrid vehicle, comprises a battery monitoring system of the motor vehicle and a computer that is external to the motor vehicle, wherein the battery monitoring system is configured for determining basic data for the prediction of a deeply discharged state at least of a traction battery of the vehicle and for transmission of the basic data via a first communications link to the external computer and the external computer is configured for determining an expected point in time of the deep discharge, for monitoring the reaching of a warning point in time, which is in advance of the expected point in time of the deep discharge by an early warning time, and for transmitting a first warning signal to a first monitoring instantiation that can be specified if the warning point in time is reached. The device is especially designed for performing the method described above for monitoring at least one traction battery of a motor vehicle.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
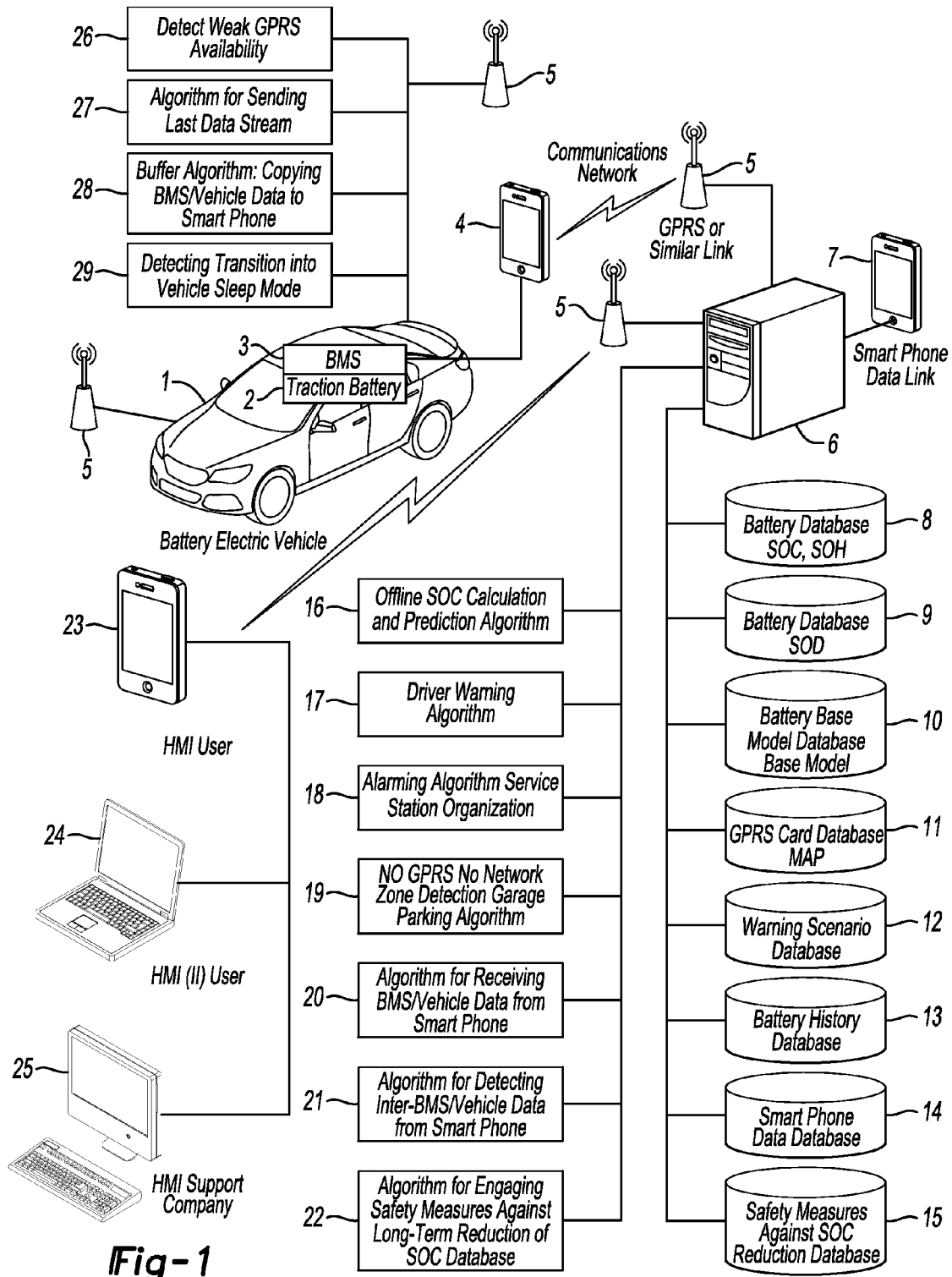
FIG. 1 shows a monitoring system that comprises an exemplary embodiment of a device according to the invention.

In FIG. 1 symbolic elements of a device for monitoring the state of discharge of a traction battery of a battery electrically driven motor vehicle are illustrated. The motor vehicle 1 comprises a traction battery 2, which is monitored by a battery monitoring system (BMS) 3. Present state data of the traction battery 2 that are determined by the battery monitoring system 3, especially the battery current, the battery voltage, the battery temperature and the state of charge (SOC) and state of discharge (State of Discharge, SOD) determined from said data, are transmitted by a transmitter associated with the motor vehicle via a first communications link, which in the exemplary embodiment is a wireless communications network 5 based on the GPRS protocol, to an external computer that is not associated with the motor vehicle, e.g. a server 6. The transmitter can, for example, also be in the form of a mobile telephone or smart phone 4. In the case in which the communications network 5 is not available, a data transmission can even take place, for example, via the smart phone 4 to a smart phone 7 that is connected to the server 6. The battery monitoring system 3 and/or the smart phone 4 are configured for executing a program 26 for the detection of a reduction in quality of the wireless communications network 5, a program 27 for transmission of the respective last determined state data, a program 28 for transmitting the data to the smart phone 4 and a program 29 for detection of parking or leaving the motor vehicle 1.

The motor vehicle 1 or the battery monitoring system 3 or the smart phone 4 comprises a memory for storing the respective last determined battery state data and possibly operating data of the motor vehicle and data of the wireless communications link. The battery monitoring system 3 or the smart phone 4 is also designed such that the quality of transmission of the wireless communications link 5 is monitored and on detecting a reduction of the quality of transmission, the present data of the traction battery 2 are transmitted. The present data are also transmitted at least when the motor vehicle 1 is parked. The external computer in the illustrated exemplary embodiment is designed as a server 6 that comprises a memory in which a battery model is stored in a memory area 10. The memory further comprises other memory areas 8, 9, 13 in which the last transmitted data of the fraction battery 2 of the motor vehicle 1 or data derived therefrom are stored, especially the state of charge (SOC), the charge capacity (SOH) and the state of discharge (SOD) as well as data about the previous operation of the traction battery 2. Data relating to the communications link, data about possible warning processes and communications addresses for transmitting warning signals as well as data for determining an early warning time are stored in other memory areas 11, 12, 14, 15.

The server 6 is configured to run programs that include a program 16 for offline calculation of the state of charge SOC even when there is no communications link 5 and for determining an expected point in time at which the deeply discharged state is reached. The server is also configured to run a program 17 for the transmission of a warning signal to the driver as well as to run a program 18 for the transmission of a warning signal to a higher level monitoring instantiation, e.g. a workshop, a program 19 for determining whether the wireless communications link 5 is available, a program 20 for receiving the basic data from the smart phone 4, a program 21 for receiving interim basic data from the smart phone 4, and a program 22 for determining an early warning time.

The server 6 is configured such that on reaching a warning point in time, which is in advance of the determined expected point in time of the deep discharge by the early warning time, a first warning signal is transmitted to the driver, and that in the case in which no confirmation signal by the driver is received after sending the warning signal, further warning signals are sent to the higher level monitoring instantiations. The warning signals can be transmitted via wireless or wired transmission paths to the driver's smart phone 4 or to a control device, which can, for example, comprise a smart phone 23, a laptop computer 24 or a stationary computer 25, depending on the particular determination via the wireless communications link 5. The warning signals can be simple, e.g. audible, warning signals, but can also represent, for example, messages that can be transferred by E-Mail, SMS or voicemail; this enables the receiver to be informed about the reason for the message. Such messages can also contain further information, e.g. the location of the motor vehicle or a security code of the motor vehicle, which are necessary for the performance of maintenance measures by the monitoring instantiation.

Figure 2:
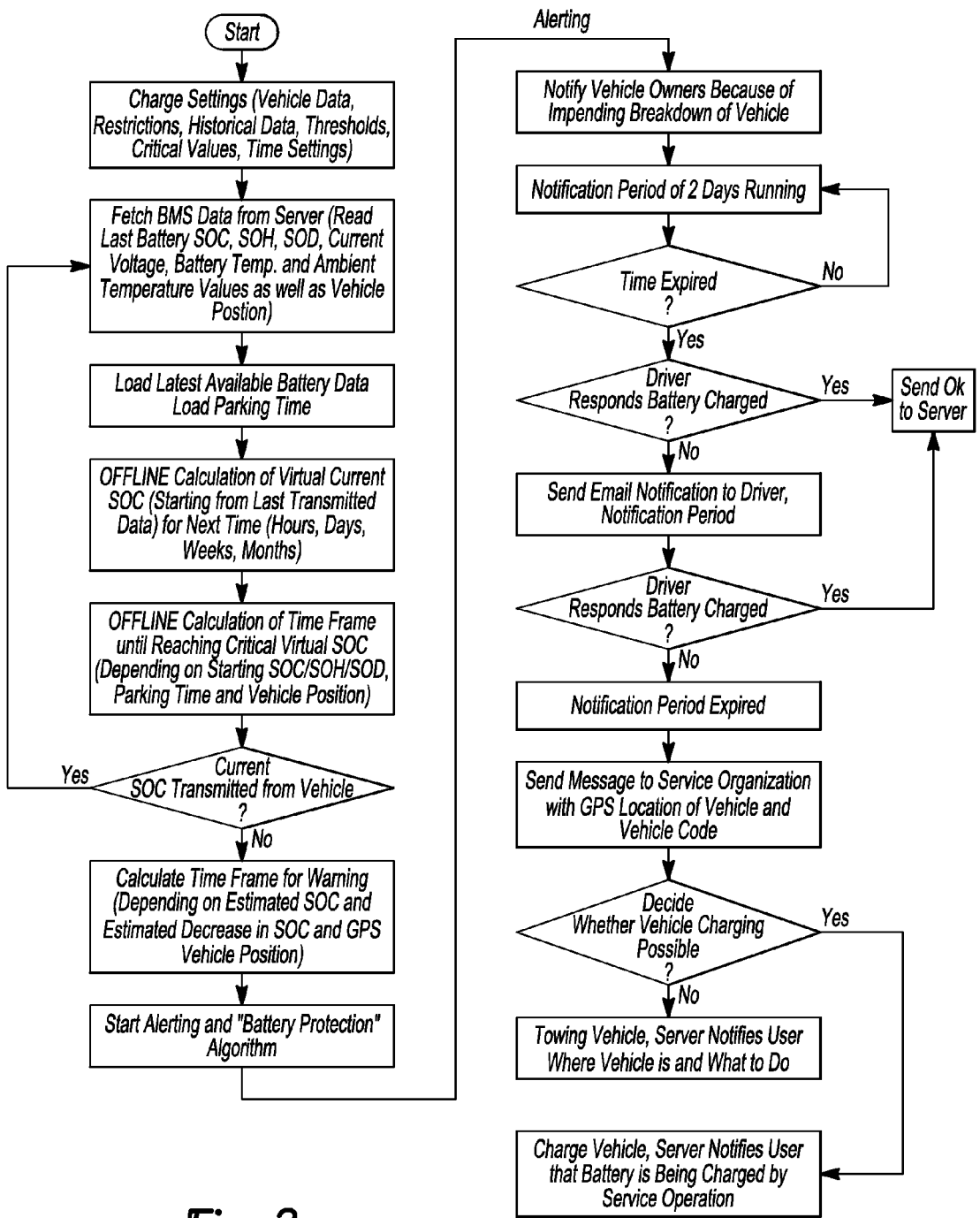
FIG. 2 shows a simplified process diagram of an exemplary embodiment of a method according to the invention.

In FIG. 2 a simplified process diagram according to an exemplary embodiment of the method according to the invention is illustrated. After setting data have first been loaded, the present battery data are loaded by the server via the wireless communications link. A point in time at which a critical state of charge is expected to be reached is determined therefrom, assuming a discharge current starting from a point in time at which the motor vehicle has been parked. This is especially related to the state of charge determined at the starting time of the process, the charge capacity and the state of discharge of the battery. If present data have been transmitted by the battery monitoring system of the motor vehicle, the calculation is repeated. If this is not the case, a warning point in time is calculated. This relates to the previously calculated point in time of the deep discharge and an early warning time that can be specified in advance, or that can even be determined, for example, taking into account the geographical position of the motor vehicle. If the warning point in time is reached, the driver, the owner or another predetermined monitoring instantiation is notified of the impending reaching of the point in time of the deep discharge. Such a warning can, for example, occur two days before reaching said point in time. If following the sending of said first warning signal a first reaction time has expired without a confirmation signal having been received, another warning signal is sent to a predetermined next higher level monitoring instantiation. A corresponding reaction time is also monitored here. Following the expiry of said reaction time another warning signal is sent to a higher level monitoring instantiation, e.g. to a breakdown service. If a confirmation signal has been received, then the process is terminated.

According to the exemplary embodiment of the method illustrated in FIG. 2, the state of charge (SOC) and the charge capacity (SOH) of the traction battery are thus calculated offline, i.e. by a server located outside the vehicle and without there being a continuous contact to the motor vehicle, wherein an initial contact with the vehicle for supplying the required raw data is sufficient. A battery model represents the discharge behavior of the traction battery, so that without a connection to the vehicle the discharging can be calculated when parking Using the basic data of the traction battery that is transmitted when switching off or leaving the vehicle and using the battery model, a pre-calculation of the battery discharge of the traction battery takes place when the vehicle is stationary. Because the pre-calculation of the battery discharge and the determination of a point in time at which a deeply discharged state is expected to be achieved take place offline, it is possible to perform even if the vehicle remains in areas without network access for a long period. During the next starting process and with a communications link available, the server automatically receives updated data sets. If a critical battery state that can lead to lasting damage to the battery is reached or is impending in a short time, warning signals are sent to predetermined monitoring instantiations according to a staged process.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method comprising:
receiving, from a battery monitoring system of a vehicle, data for prediction of a deep discharge state of a traction battery of the vehicle at a computer remote from the vehicle;
transmitting by the computer a first warning signal to the battery monitoring system responsive to determination that a period of time until an expected deep discharge as derived from the data is less than a predetermined deep discharge warning time period that depends on a current location of the vehicle; and
transmitting by the computer a second warning signal responsive to an absence of a received confirmation signal from the battery monitoring system within a predetermined reacting time period, wherein the confirmation signal is initiated based on receipt of the first warning signal by the battery monitoring system.

2. The method as claimed in claim 1, wherein the data comprise operating data of the vehicle.

3. The method as claimed in claim 1, wherein the period of time is derived via a battery model that is stored in a memory that can be accessed by the computer.

* * * * *